United States Patent
Murakami et al.

(10) Patent No.: US 7,233,206 B2
(45) Date of Patent: Jun. 19, 2007

(54) SEMICONDUCTOR INTEGRATED CIRCUIT DEVICE AND WIRELESS COMMUNICATION SYSTEM

(75) Inventors: Motoki Murakami, Yokohama (JP); Kazuaki Hori, Yokohama (JP); Kazuhiko Hikasa, Hamura (JP)

(73) Assignee: Renesas Technology Corp., Tokyo (JP)

( * ) Notice: Subject to any disclaimer, the term of this patent is extended or adjusted under 35 U.S.C. 154(b) by 580 days.

(21) Appl. No.: 10/422,953

(22) Filed: Apr. 25, 2003

(65) Prior Publication Data
US 2003/0228852 A1    Dec. 11, 2003

(30) Foreign Application Priority Data
Jun. 6, 2002  (JP)  ............................. 2002-165833

(51) Int. Cl.
*H03G 3/10*  (2006.01)
(52) U.S. Cl. ...................................... 330/278; 330/254
(58) Field of Classification Search .. 455/127.1–127.5, 455/552.1, 101–103, 303, 304, 305, 324, 455/136; 330/124 R, 295, 278, 254, 252, 330/129, 261
See application file for complete search history.

(56) References Cited

U.S. PATENT DOCUMENTS

| 4,608,464 | A  | * | 8/1986  | Morikawa et al. ..... 379/406.06 |
| 6,480,700 | B1 | * | 11/2002 | Groe et al. .................... 455/69 |
| 6,618,365 | B1 | * | 9/2003  | Vannatta et al. ............ 370/333 |
| 7,076,224 | B2 | * | 7/2006  | Giry-Cassan et al. .... 455/241.1 |
| 7,157,973 | B2 | * | 1/2007  | Sobel .......................... 330/282 |
| 7,170,345 | B2 | * | 1/2007  | Hongo ....................... 330/149 |
| 2002/0160734 | A1 | * | 10/2002 | Li et al. .................. 455/245.1 |

FOREIGN PATENT DOCUMENTS

JP         9-64666         3/1997

* cited by examiner

*Primary Examiner*—Henry Choe
(74) *Attorney, Agent, or Firm*—Mattingly, Stanger, Malur & Brundidge, P.C.

(57) ABSTRACT

As the gain control amplifiers for amplifying the reception signal, the step amplifiers are used. Two sets of these step amplifiers are provided and are then controlled to be used alternately. When switching of the gain occurs, after the gain is switched with the step amplifier not operated and offset is cancelled, the amplifier to which the reception signal is inputted is switched. Accordingly, the step amplifier can be used as the gain control amplifier for amplifying the reception signal to provide almost constant power consumption even when the gain is changed depending on the intensity of reception signal in the semiconductor integrated circuit device for communication to form a wireless communication system of dual-mode or more modes including the W-CDMA system. As a result, the operation life of battery, namely, the reception waiting period and communication period by single charging process can be expanded.

5 Claims, 10 Drawing Sheets

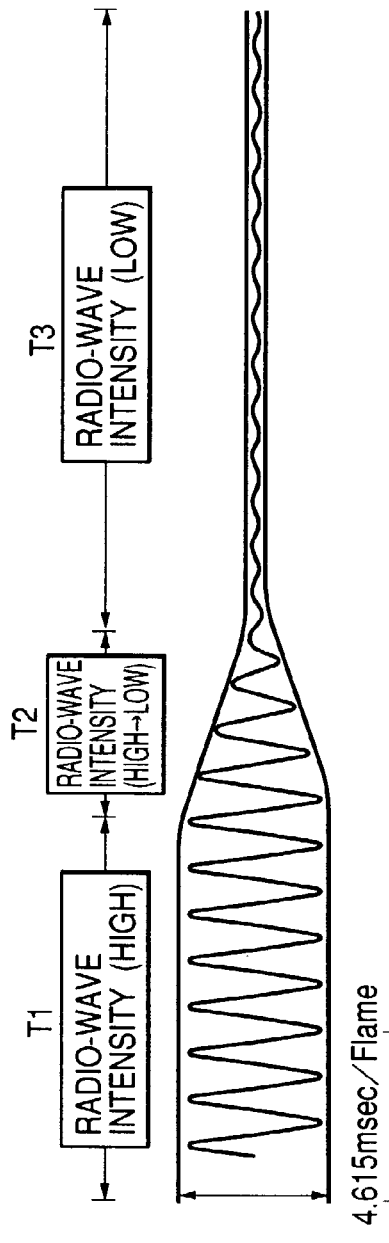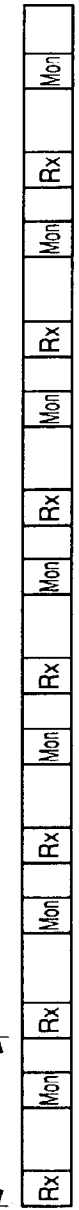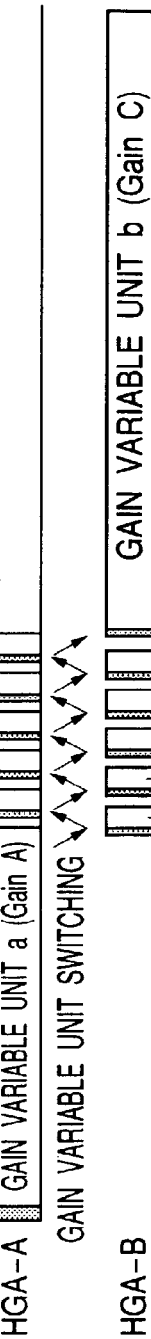

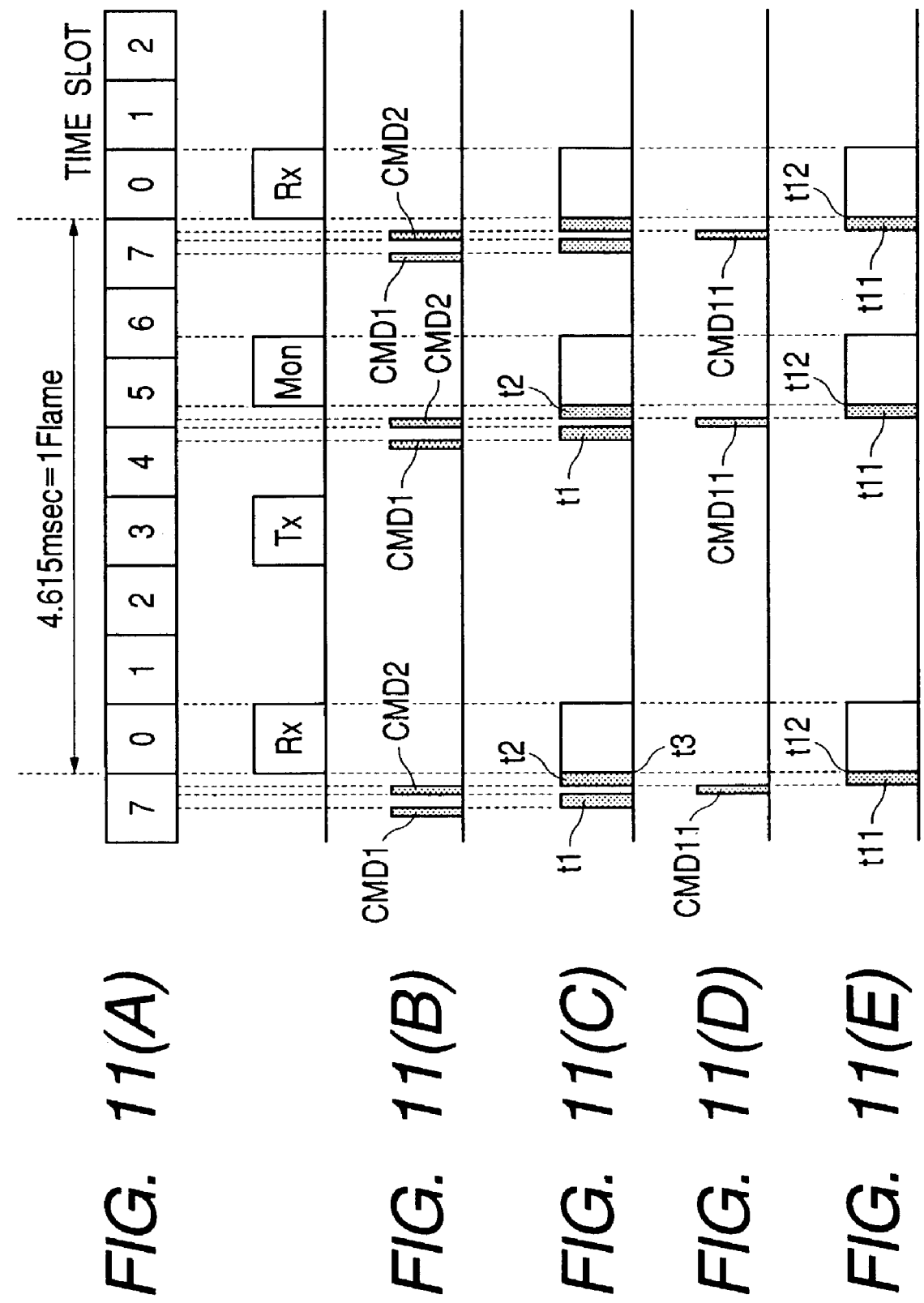

SEMICONDUCTOR INTEGRATED CIRCUIT DEVICE AND WIRELESS COMMUNICATION SYSTEM

BACKGROUND OF THE INVENTION

The present invention relates to a semiconductor integrated circuit, particularly a semiconductor integrated circuit device for communication comprising an signal amplifying circuit which can select variable gains and a high-gain amplifying circuit for amplifying the reception signal of a wireless communication equipment and also relates to the technique which can effectively be applied to the wireless communication equipment such as a portable telephone comprising the same semiconductor integrated circuit device for communication.

In the wireless communication equipment (mobile communication equipment) such as a mobile telephone and a portable telephone, a low-pass filter and a gain control amplifier are provided for the purpose that a baseband circuit amplifies weak reception signal up to the predetermined level enough for realizing various processes while it is eliminating noise and unwanted frequency signals.

In general, in the portable telephone of the conventional GSM (Global System for Mobile Communication) and DCS (Digital Cellular System), a step amplifier which can change step by step the gain depending on the reception signal level is used as a gain control amplifier. Meanwhile, in the portable telephone of the W-CDMA (Wideband Code Division Multiple Access) system, a linear amplifier which can linearly control the gain is proposed as an amplifier for amplifying the reception signal.

SUMMARY OF THE INVENTION

In comparison of a step amplifier with a linear amplifier, the linear amplifier exhibits large fluctuation of power consumption because gain is varied with current, but the step amplifier has a merit that power consumption of battery can be reduced in the system driven with a battery because power consumption does not change to a large extent even if gain is varied. Moreover, the linear amplifier has a disadvantage that the gain control range is narrower than that of the step amplifier and the amplifier may be saturated in the high-gain range to result in distortion of signal.

Even when such a disadvantage is considered, the linear amplifier is still used for the portable telephone in the W-CDMA system based on the major reason that the input DC offset of amplifier must be cancelled whenever the gain is varied in the step amplifier but there is no time for canceling the DC offset in the W-CDMA system because the continuous receiving operation is required. Meanwhile, in the portable telephone of the GSM system and DCS system, the step amplifier can be used because the transmission mode and reception mode are switched in the unit of time (for example, 577 μS) called the time slot and DC offset can be cancelled at the time of switching the transmission mode and reception mode.

The inventors of the present invention have investigated the possibility for common use of the amplifier to amplify the reception signal in both systems in order to develop the dual-mode portable telephone of the W-CDMA system and GSM system and have reached the conclusion that common use is difficult because the types of amplifiers are different as described above. The present invention has been attained in the course of investigation of the common use of receiving amplifier.

There has been proposed the invention disclosed in the Japanese Patent Unexamined Publication No. Hei 9(1997)-64666 as the technique similar to the present invention but the present invention is different from such prior art in the purpose and condition for switching of the amplifier.

An object of the present invention is to provide a semiconductor integrated circuit device to form a wireless communication system of the dual or more modes including the W-CDMA system which can use a step amplifier as the gain control amplifier to amplify the reception signal, thereby to keep power consumption to almost constant value even when the gain is changed depending on the intensity of reception signal and to assure longer battery life in the portable telephone, namely longer reception waiting period and communication period through single charging process.

Another object of the present invention is to provide a semiconductor integrated circuit device and a wireless communication system using the same circuit device which can widen the gain control range of gain control amplifier to amplify the reception signal in order to improve the CN ratio.

The aforementioned and the other objects and novel features of the present invention will become apparent from the description of the present specification and the accompanying drawings.

The typical inventions disclosed in the present specification will be briefly described as follows.

Namely, the first invention of the present specification relates to the semiconductor integrated circuit device for wireless communication system for continuous reception while the gain is changed as in the case of the W-CDMA system, in which a step amplifier is used as the gain control amplifier to amplify the reception signal, and two step amplifiers are provided and are controlled for alternative operation, and if the gain is switched, the amplifier to which the reception signal is inputted is switched after the gain is switched with the step amplifier not operated and the offset is cancelled.

According to the means described above, since a step amplifier is used as the gain control amplifier, power consumption can be set almost to the constant value even when the gain is changed depending on the intensity of reception signal and moreover since two step amplifiers are provided to change the gain and the input reception signal is switched after the cancellation of offset, missing of the receiving data due to the offset canceling operation can be eliminated even if the signal can be received continuously.

The second invention of the present specification relates to the semiconductor integrated circuit device for wireless communication system for dual-mode or more modes including the mode for continuous reception while the gain is changed as in the case of the W-CDMA system, in which a step amplifier is used as the gain control amplifier for amplifying the reception signal, a plurality of filter circuits for removing unwanted frequency and noise are provided depending on the frequency of each mode, the filter circuit is switched depending on the selected mode, and thereby switching of gain and canceling of offset are performed almost simultaneously. Here, the mode means the communication system of different multiplexing system and modulation system such as the GSM system, DCS system and W-CDMA system. Since the GSM system and DCS system are identical in the multiplexing system and modulation system but are different only in the frequency band used, these are considered as the same mode in this specification.

According to the means described above, since a step amplifier is used as the gain control amplifier, power consumption can be controlled almost to the constant value even when the gain is changed depending on the intensity of reception signal and moreover in the mode including the function for repairing the receiving data, for example, such as the W-CDMA system, any problem does not occur in the receiving operation because if a part of the receiving data is lost, such missing data can be recovered by switching the gain and canceling the offset during the receiving operation.

BRIEF DESCRIPTION OF THE DRAWINGS

FIGS. 10A to 10F are timing charts illustrating the control timings in the receiving system circuit of the second embodiment.

FIGS. 11A to 11E are timing charts illustrating the control timings when the reception signal of GSM or DCS is amplified in the receiving system circuit of the second embodiment.

DETAILED DESCRIPTION OF THE EMBODIMENTS

The preferred embodiments of the present invention will be described in detail with reference to the accompanying drawings.

Embodiment 1

Figure 1:
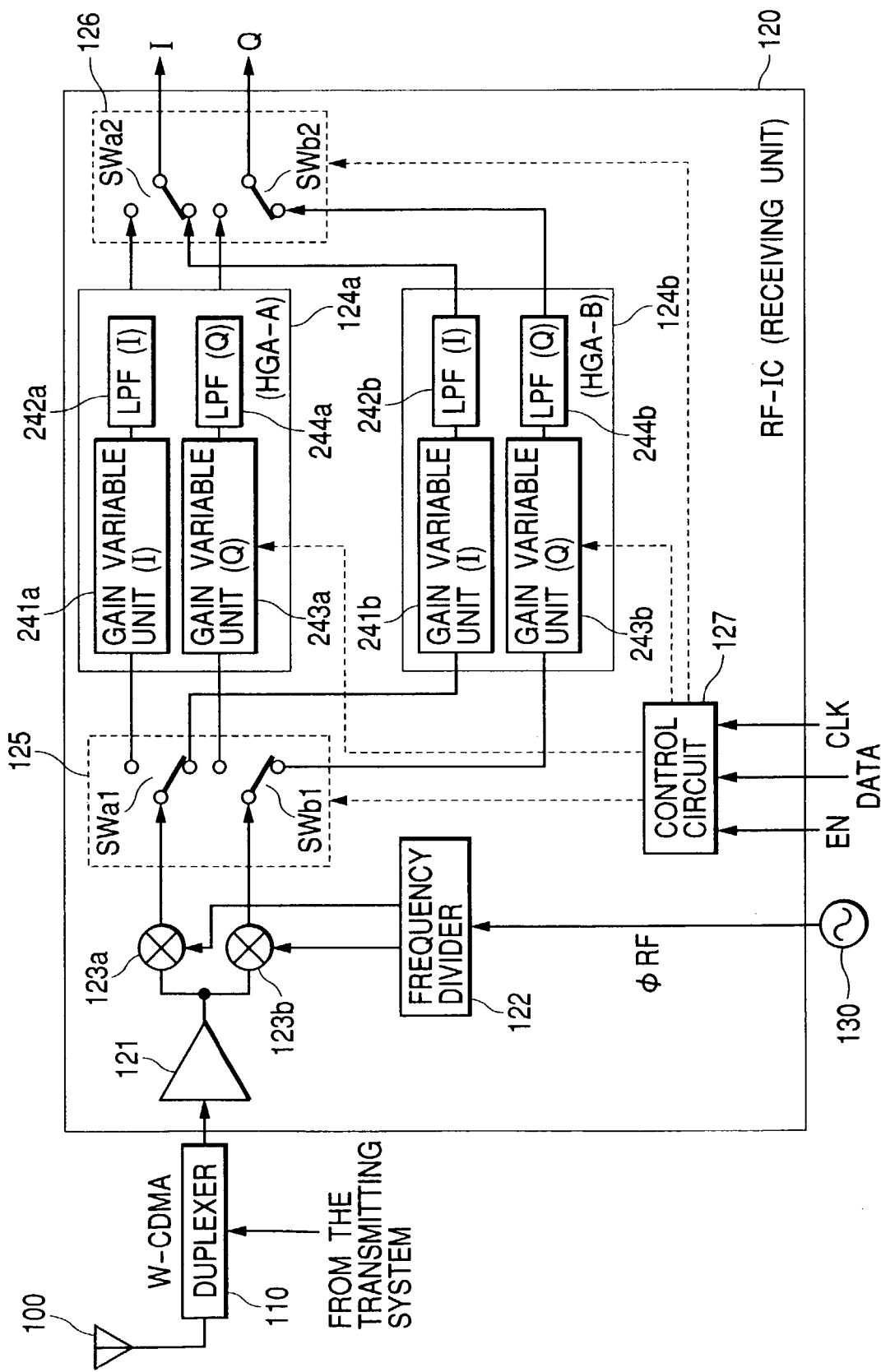
FIG. 1 is a block diagram illustrating an example of structure of a receiving system circuit of a portable telephone as the first embodiment to which the present invention is suitably applied.

FIG. 1 illustrates an example of structure of receiving system circuit of portable telephone as the first embodiment to which the present invention is suitably applied. Although not particularly restricted, this embodiment can be suitably applied to a communication system for continuously receiving the reception signal of the W-CDMA system.

In FIG. 1, numeral 100 designates an antenna for transmitting and receiving a signal wave; 110, a duplexer (branching filter) consisting of a filter for branching the transmitting signal and the reception signal; 120, a receiving system circuit of direct conversion system for demodulating and amplifying, without via the intermediate frequency, the reception signal branched by the duplexer 110 and then converting the reception signal to the baseband signal; 130, an oscillation circuit for generating a high frequency oscillation signal φRF as high as 4220 to 4340 MHz required for frequency conversion (down conversion) or the like of the reception signal.

The receiving system circuit 120 of this embodiment comprises a low noise amplifying circuit (LNA) 121 for amplifying the signal received by the antenna 100, a frequency-dividing phase circuit 122 for dividing frequency of the oscillation signal φRF generated by the oscillation circuit 130 to generate a pair of orthogonal signals having phase difference of 90°, mixers (MIX) 123a, 123b for combining the reception signal amplified by LNA 121 and the signal frequency-divided by the frequency-dividing circuit 122 to down-convert in direct these signal to the baseband signals I, Q of the audio frequency and then demodulate these signals, two sets of high grain amplifying units 124a, 124b including a gain controllable amplifier (GCA) and a low-pass filter (LPF) to amplify the demodulated signals to the predetermined level, a switching circuit 125 consisting of switches SWa1, SWb1 for selectively inputting the demodulated signals from the mixers (MIX) 123a, 123b to any one of the high-gain amplifying units 124a or 124b, a switching circuit 126 consisting of switches SWa2, SWb2 for supplying an output of the high-gain amplifying unit in the side controlled and selected in conjunction with the switching circuit 125 to the baseband circuit not illustrated, and a control circuit 127 for controlling the switching of the switch circuits 125 and 126.

The high-gain amplifying unit (HGA-A) 124a is composed of gain control amplifying circuit 241a for amplifying the I signal, low-pass filter 242a for band limitation, gain control amplifying circuit 234a for Q signal and low-pass filter 244a. Moreover, like 124a, the high-gain amplifying unit (HGA-B) 124b is also composed of high-gain amplifying circuit 241b for I signal, low-pass filter 242b, a gain control amplifying circuit 243b for Q signal and low-pass filter 244b. The low-pass filters 244a, 244b are formed of resistor and capacitor or the like and has the preset frequency band to make the signal of the 2 MHz band pass in the case of the portable telephone of the W-CDMA system.

Although not illustrated in FIG. 1, a SAW filter for removing unwanted wave from the signal received from the antenna 100 is sometimes provided in the preceding stage of the low-noise amplifying circuit (LNA) 121. In this embodiment, although not particularly restricted, the receiving system circuit 120, oscillation circuit 130 and transmission system circuit not illustrated are formed as the semiconductor integrated circuit on single semiconductor substrate such as single crystal silicon, except for the external components such as filter capacitor and crystal-controlled oscillator.

Figure 2:
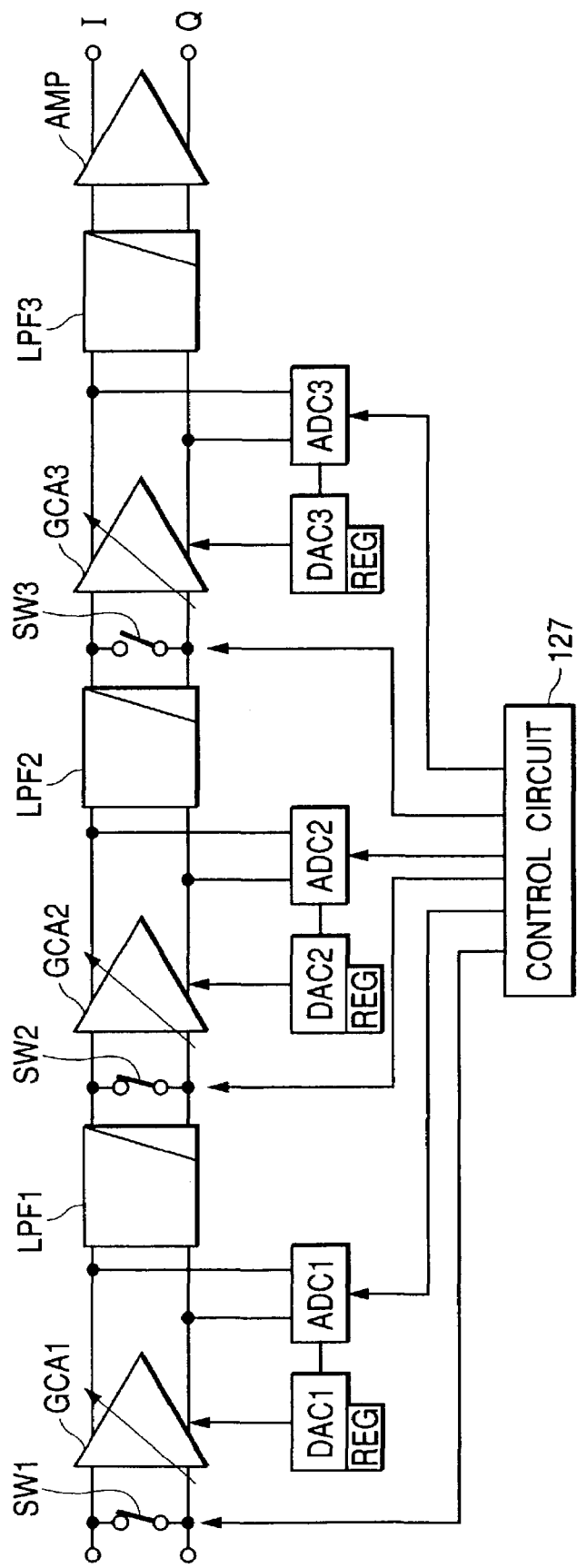
FIG. 2 is a block diagram illustrating an example of structure of high-gain amplifier unit of the receiving system circuit of FIG. 1.

FIG. 2 illustrates an example of detailed structure of the high-gain amplifying units 124a, 124b in FIG. 1. As illustrated in FIG. 2, the high-gain amplifying units 124a, 124b have the structures that a plurality (for example, three) of gain control amplifiers GCA1, GCA2, GCA3 and low-pass filters LPF1, LPF2, LPF3 are alternately connected in series and an amplifier AMP having the fixed gain is connected in the final stage.

Moreover, there are provided the switches SW1, SW2, SW3 for terminating the input terminals when the offset of each gain control amplifier GCA1, GCA2, GCA3 is cancelled, the AD converting circuits ADC1, ADC2, ADC3 for converting output voltage differences to digital signals corresponding to each gain control amplifier GCA1, GCA2, GCA3, and the DA converting circuits DAC1, DAC2, DAC3 for giving the input offset voltage to make DC offset of output to "0" for the differential input of the corresponding gain control amplifiers GCA1, GCA2, GCA3 based on the comparison result by the AD converting circuit. The control circuit to realize offset canceling operation (calibration) by controlling the AD converting circuits ADC1 to ADC3 and DA converting circuits DAC1 to DAC3 can be provided as the exclusive control circuit but in this embodiment, the control circuit 127 for controlling the entire part of the receiving system circuit 120 is configured to operate as the control circuit described above.

In regard to the calibration, the control circuit 127 performs first the DC offset calibration of the gain control amplifier GCA1 of the first stage based on the command from the baseband circuit and the calibration is sequentially performed stage by stage in such a manner that when the calibration of the first stage is completed, the second stage is calibrated and when the calibration of the second stage is completed, the third stage is calibrated.

Moreover, although not particularly restricted, for the DC offset calibration of each stage, the sequential comparison system is employed, wherein comparison of differential outputs of amplifiers GCA1, GCA2, GCA3 by the AD converting circuits ADC1, ADC2, ADC3 and application of voltage to the amplifiers GCA1, GCA2, GCA3 by the DA converting circuits DAC1, DAC2, DAC3 are sequentially repeated. The DA converting circuits DAC1, DAC2, DAC3 are capable of selecting only one voltage from the voltage values of 2 n levels and also outputting this voltage by combining the n (n is a positive integer, for example, a value 6)—weight currents, for example, in the relationship of i, $2i$, $4i$, $8i$, . . . according to the input signal of n bits and then converting these currents to the voltages.

The calibration of gain control amplifiers GCA1, GCA2, GCA3 of each stage is executed respectively by repeating, for example, six times the comparison of the amplifier outputs of the AD converting circuits ADC1, ADC2, ADC3 with the reference voltage by the timing signal from the control circuit 127 and application of voltage to the differential amplifier input by the DA converting circuits DAC1, DAC2, DAC3 depending on the result of AD conversion. When the calibration is completed, the final DA input value required to set the DC offset of each amplifier to "0" is stored in the registers REG provided in the DA converting circuits DAC1, DAC2, DAC3 and this condition is maintained until execution of the next calibration.

The calibration system of the gain control amplifier with the AD converting circuits and DA converting circuits as described above have been applied as several patents by the applicant of the present invention and moreover since the calibration system itself is not related in direct to the present invention, detail illustration and description of the circuit are omitted here.

Figure 3:
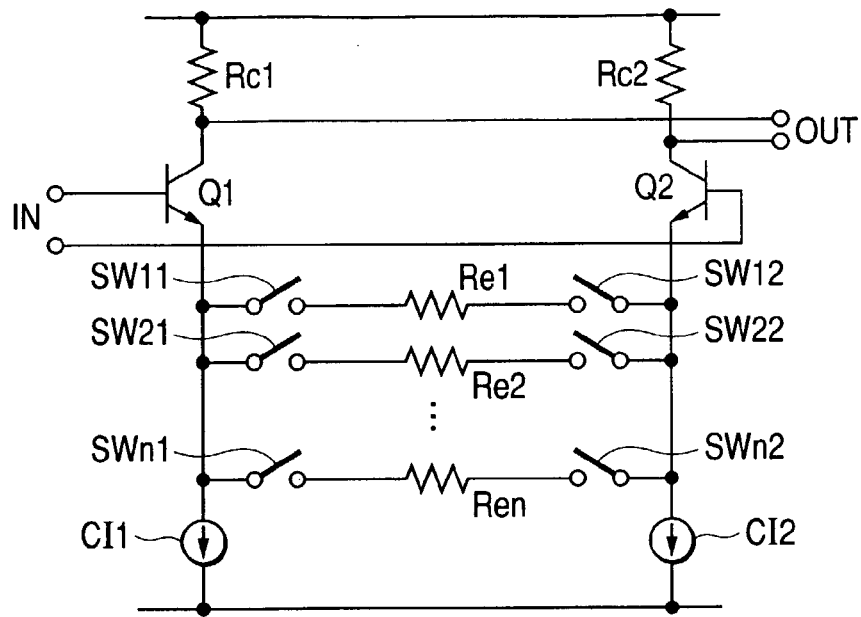
FIG. 3 is a circuit diagram illustrating a practical circuit example of step amplifier used as the gain control amplifier of the receiving system circuit of FIG. 1.
Figure 4:
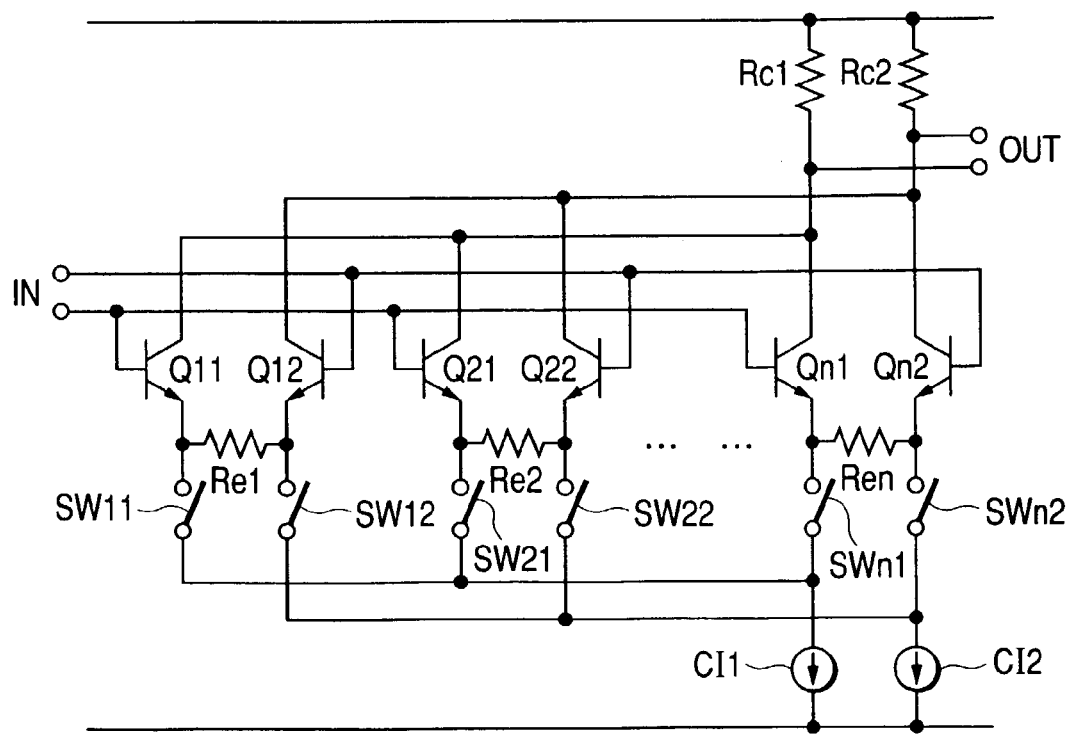
FIG. 4 is a circuit diagram illustrating an example of the other circuit of the step amplifier used as the gain control amplifier of the receiving system circuit of FIG. 1.

FIG. 3 and FIG. 4 illustrate practical examples of circuit of the step amplifier used as the gain control amplifiers GCA1, GCA2, GCA3. In the gain control amplifier of FIG. 3 among these amplifiers, a plurality of resistors Re1, Re2, . . . , Ren of different resistance values are connected in parallel between the emitter terminals of a pair of differential bipolar transistors Q1, Q2 and these resistors are connected or disconnected with the switches SW11, SW12; SW21, SW22; . . . SWn1, SWn2. The resistors Re1, Re2, . . . , Ren may have the equal resistance value but when these resistors are formed to have, for example, the weight of 2×n, the gain can be changed depending on the combination of switches to be turned ON.

The gain control amplifier of FIG. 3 operates as the amplifier which provides smaller gain when the resistance value of resistor connected between the emitter terminals of the differential bipolar transistors Q1, Q2 becomes larger and also operates as the amplifier which provides larger gain when the resistance value of resistor connected becomes smaller. Rc1, Rc2 are collector resistors, while CI1, CI2 are constant current sources. The switches SW11, SW12; SW21, SW22, . . . , SWn1, SWn2 are controlled for ON and OFF with the control circuit 127 based on the command from the baseband circuit.

The gain control amplifier of FIG. 4 has the structure that a plurality of sets of differential bipolar transistors forming pairs with each other Q11, Q12; Q21, Q22, . . . , Qn1, Qn2 are connected to the resistors Re1, Re2, . . . , Ren having different resistance values and connected respectively between the emitter terminals of each pair of transistors and the emitters of transistors Q11, Q12; Q21, Q22, . . . , Qn1, Qn2 are connected to and disconnected from the common constant current sources CI1, CI2 via the switches SW11, SW12; SW21, SW22; . . . , SWn1, SWn2.

The gain control amplifier of FIG. 4 operates as the amplifier which provides smaller gain when the resistance value of resistor connected between the emitter terminals of the bipolar transistors connected to the switch in the ON state, namely to the constant current sources CI1, CI2 becomes larger and also operates as the amplifier which provides larger gain when the resistance value of resistor connected between the emitter terminals of the transistors connected becomes smaller. Rc1, Rc2 are common collector resistors, and CI1, CI2 are constant current sources. The switches SW11, SW12; SW21, SW22; . . . , SWn1, SWn2 are controlled for ON and OFF with the control circuit 127 based on the command from the baseband circuit.

Although not particularly restricted, the baseband circuit and the control circuit 127 of the receiving system circuit 120 are connected with a serial bus, for example, consisting of three signal lines, the command code DATA, clock CLK which gives the latch timing of the command and enable signal EN indicating that the data is valid are supplied to the control circuit 127 from the baseband circuit, and the control circuit 127 fetches the command code DATA supplied in this timing in synchronization with the clock CLK when the enable signal EN is in the valid level and then controls the operation of the receiving system circuit 120 based on the fetched command.

Figure 5:
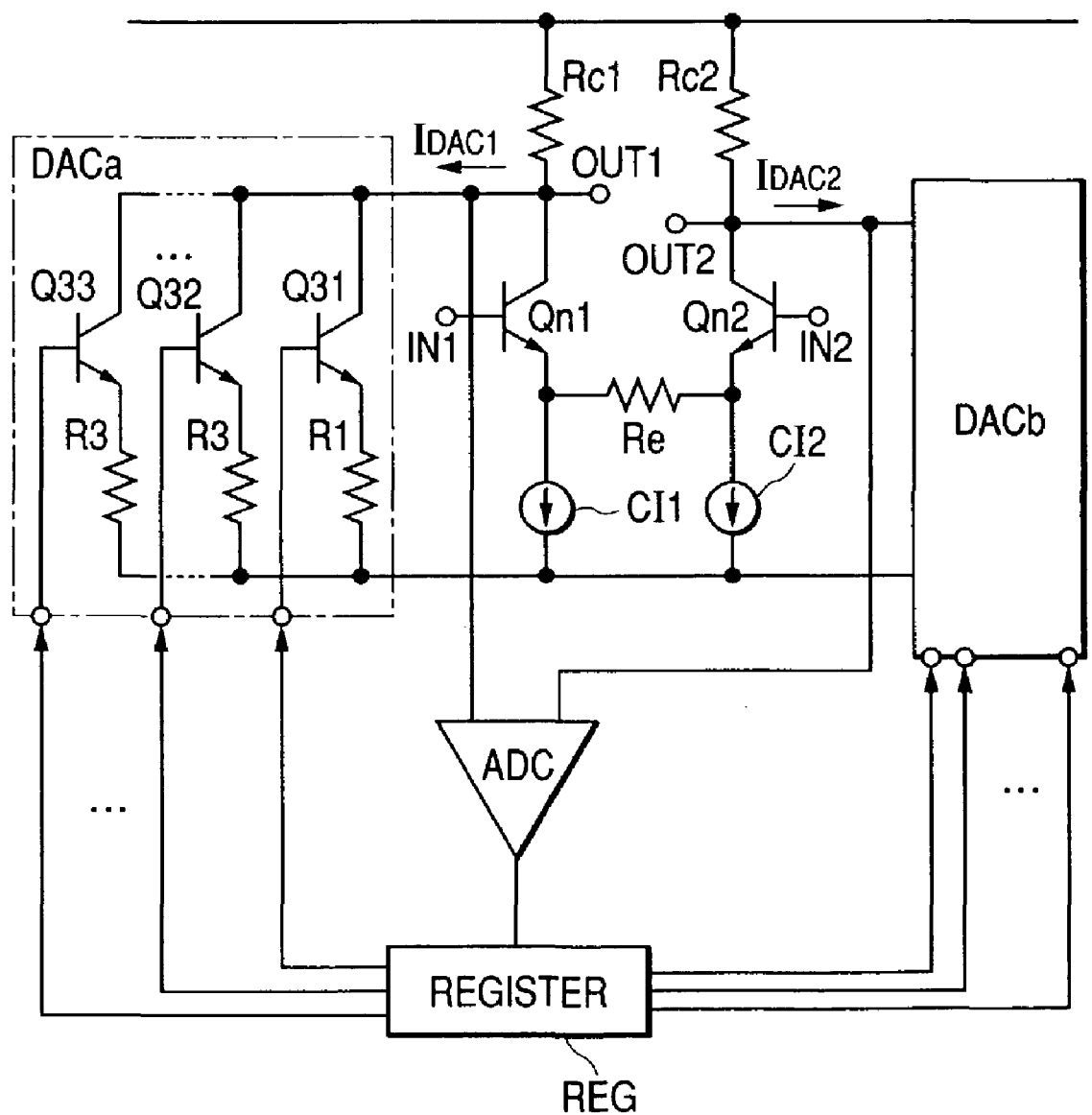
FIG. 5 is a circuit diagram illustrating an example of the gain control amplifier and DAC circuit for calibration of the receiving system circuit of FIG. 1.

FIG. 5 illustrates a practical example of circuit of the step amplifier and DAC for calibration used as the gain control amplifiers GCA1, GCA2, GCA3.

In FIG. 5, the transistors Qn1, Qn2 illustrate the simplified forms of the transistors Q11, Q12; Q21, Q22, . . . , Qn1, Qn2 of the gain control amplifiers GCA of FIG. 4, while the emitter resistor Re illustrates the simplified form of the emitter resistors Re1, Re2, . . . , Ren of FIG. 4. The part given the code DACb indicates the circuit of the same structure as the part DACa and therefore this circuit is not illustrated. The circuit DACa and the circuit DACb in FIG. 5 function as one DA converting circuit. In this embodiment, a current flowing into the transistors Q31, Q32, Q33, . . . , forming the circuits DACa and DACb is adjusted to make zero in the potential difference of the outputs OUT1, OUT2 under the condition that the inputs IN1, IN2 are terminated and a value in this case is stored in the register REG. Next, switching of gain in the receiving system circuit of the W-CDMA system of this embodiment and timing of the offset canceling operation will be explained with reference to FIG. 6.

Figure 6:
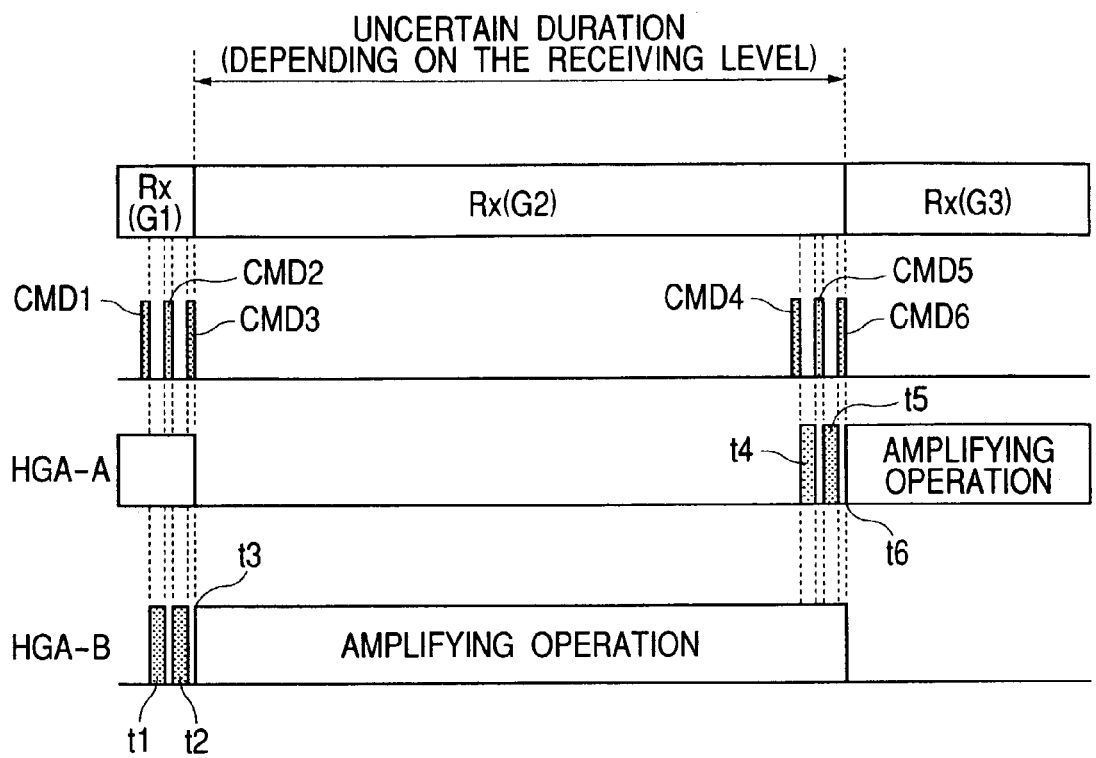
FIG. 6 is a timing chart illustrating an example of the control timing when the gain is changed in the high-gain amplifying unit depending on the level of reception signal.

FIG. 6 illustrates an example of the timing control when the gains G of the high-gain amplifying units 124a, 124b changes in the three stages of G1–G2–G3 depending on the level of reception signal.

When the command CMD1 to switch the gain to G2 is supplied to the receiving system circuit 120 from the baseband circuit while the high-gain amplifying unit 124a amplifies the reception signal in the gain G1 (the high-gain amplifying circuit 124b is not operated), a control signal (emitter resistor switching signal) to set the total gain of the gain control amplifiers GCA1, GCA2, GCA3 to G2 is supplied to the high-gain amplifying unit 124b from the control circuit 127, and the conditions of the switches SW11, SW12; SW21, SW22, . . . , SWn1, SWn2 are switched to change the gain (timing t1 in FIG. 6).

Subsequently, when the command CMD2 for canceling DC offset is supplied from the baseband circuit, the control signal (control signal of the AD converting circuit or the like) is given to the high-gain amplifying unit 124b from the control circuit 127 to execute the calibration of the gain control amplifiers GCA1, GCA2, GCA3 and thereby DC offset can be cancelled (timing t2 in FIG. 6).

Thereafter, when the command CMD3 to switch the amplifier is supplied from the baseband circuit, the control signal (the switching signal for the switches SWa1, SWb1, SWa2, SWb2) to switch the amplifier is given to the switching circuits 125, 126 from the control circuit 127, and the reception signal demodulated by the mixers 123a, 123b is supplied to the high-gain amplifier 124b in place of the amplifier 124a (timing t3 in FIG. 6).

Next, when the command CMD4 to switch the gain G2 to G3 is supplied to the receiving system circuit 120 from the baseband circuit, the control signal (emitter resistor switching signal) to set the total gain of the gain control amplifiers GCA1, GCA2, GCA3 to G3 is given to the high-gain amplifying unit 124a from the control circuit 127 and the conditions of the switches SW11, SW12; SW21, SW22, . . . , SWn1, SWn2 are switched to change the gain (timing t4 in FIG. 6).

Continuously, when the command CMD5 for canceling the DC offset is supplied from the baseband circuit, the control signal (control signal for the AD converting circuit or the like) to execute the calibration of the gain control amplifiers GCA1, GCA2, GCA3 is given to the high-gain amplifying unit 124a from the control circuit 127, the DC offset can be cancelled (timing t5 in FIG. 6).

Thereafter, when the command CMD6 for switching the amplifier is supplied from the baseband circuit, the control signal (switching circuit for the switches SWa1, SWb1, SWa2, SWb2) to switch the amplifier is given to the switching circuits 125, 126 from the control circuit 127, and the reception signal demodulated by the mixers 123a, 123b is supplied to the high-gain amplifier 124a in place of the amplifier 124b (timing t6 in FIG. 6).

Figure 7:
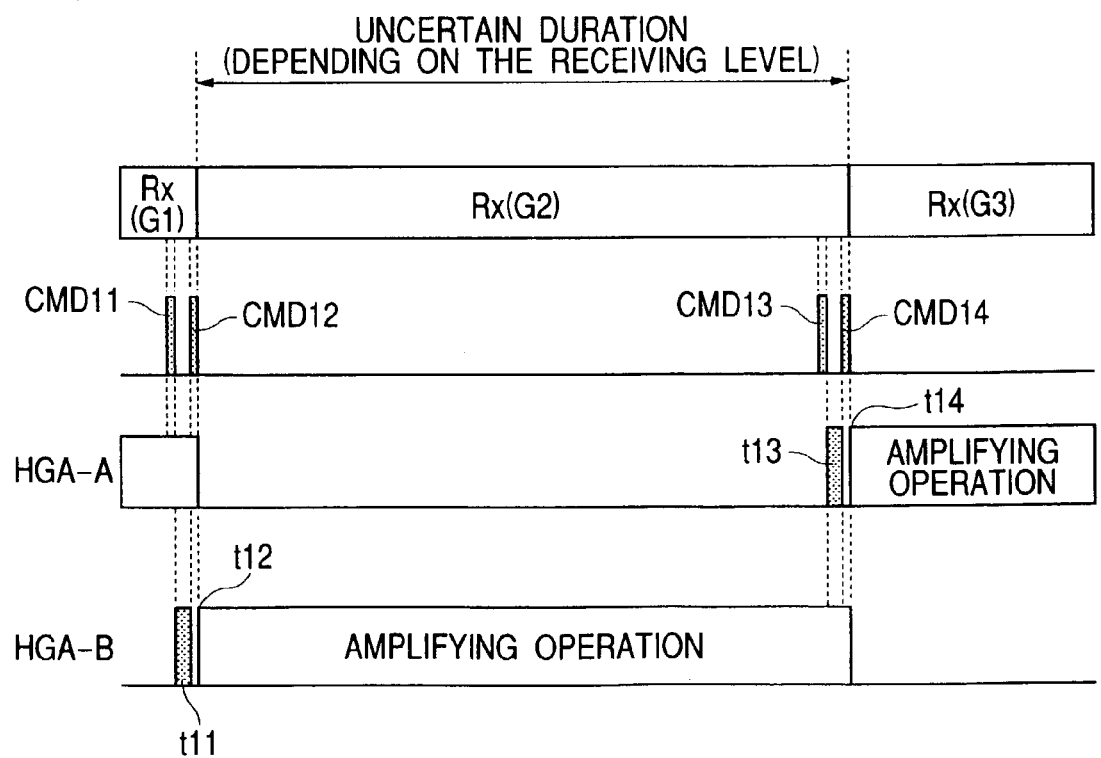
FIG. 7 is a timing chart illustrating the other example of the control timing when the gain is changed in the high-gain amplifying unit depending on the level of reception signal.

As described above, the command is divided and supplied in three times to the receiving system circuit 120 from the baseband circuit when the gain is switched. However, it is also possible to form the structure that a timer circuit is included in the control circuit 127 of the receiving system circuit 120, when the gain switching command CMD11 is supplied to the receiving system circuit 120 from the baseband circuit as illustrated in FIG. 7, the gain switching and calibration (timing t11) are performed automatically on the side of the receiving system circuit 120 and thereafter when the amplifier switching command CMD12 is supplied to the receiving system circuit 120 from the baseband circuit, the amplifier is switched (timing t12) with the switching of the switching circuits 125, 126.

Moreover, it is also possible to form the structure that the gains of the gain control amplifiers GCA1, GCA2, GCA3 are switched with the first command supplied to the receiving system circuit 120 from the baseband circuit when the gain is switched and the amplifier is continuously switched with the calibration and switching of the switching circuits 125, 126 with the second command and also to form the structure that switching of the gains of the gain control amplifiers GCA1, GCA2, GCA3, calibration and switching of amplifier with the switching circuits 125, 126 can be performed continuously with one command supplied to the receiving system circuit 120 from the baseband circuit when the gain is switched.

(Embodiment 2)

Figure 8:
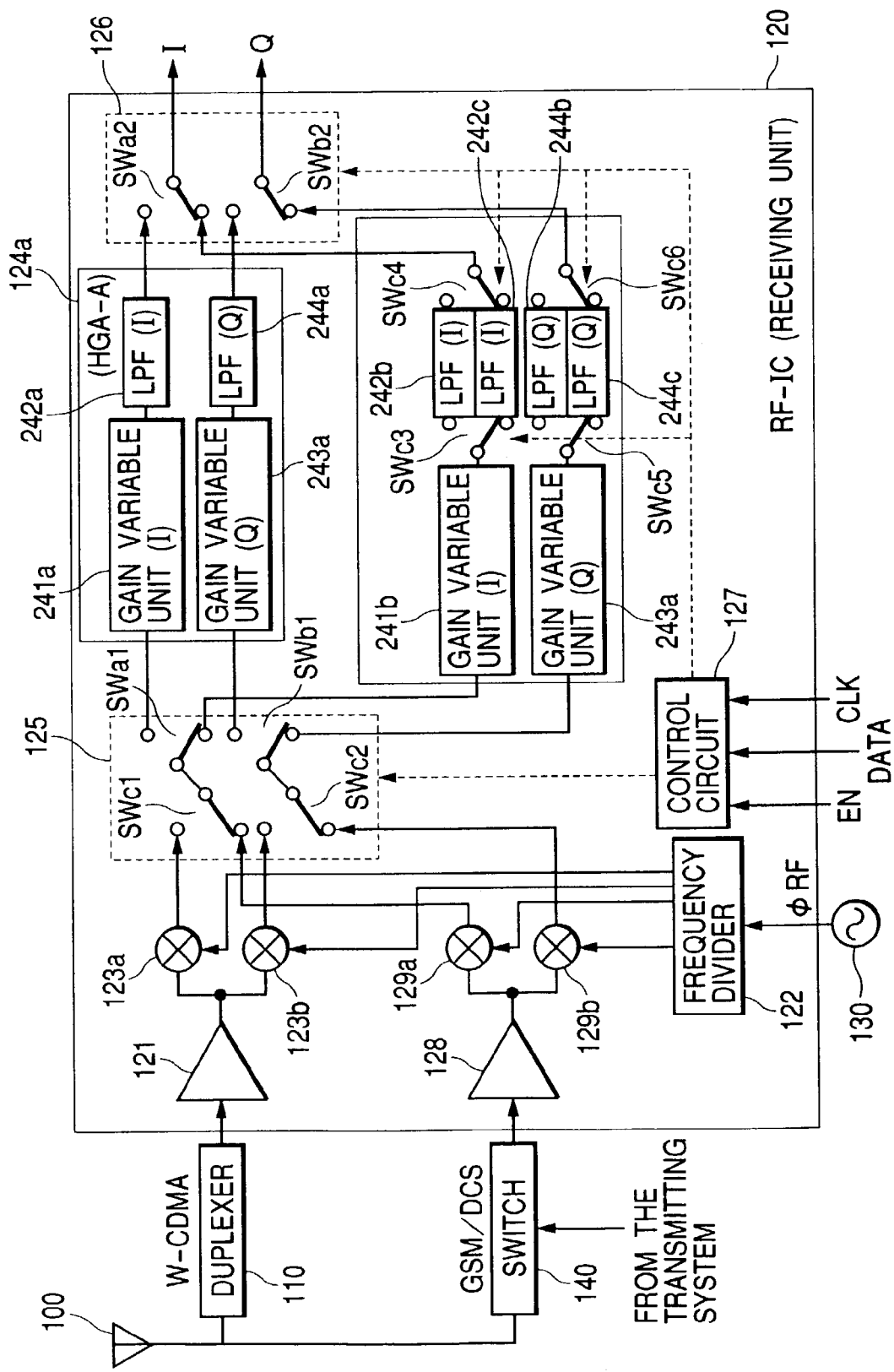
FIG. 8 is a block diagram illustrating an example of structure of receiving system circuit of the portable telephone of the second embodiment to which the present invention is suitably applied.

FIG. 8 illustrates an example of structure of the receiving system circuit of the portable telephone of a second embodiment to which the present invention can be suitably applied. Although not particularly restricted, this embodiment can be effectively applied to a dual-mode communication system which can realize communication in the W-CDMA system and GSM and DCS systems. In FIG. 8, the circuit blocks like those in FIG. 1 are designated with the like reference numerals and the duplicated description is eliminated here.

In this embodiment, a transmission/reception switch 140 for GSM and DCS systems is provided in addition to the duplexer (branching filter) 110 for separating the transmitting and reception signals of the W-CDMA system. The reason why the transmission/reception switch 140 is used for the signals of GSM and DCS systems is that the transmission and reception are performed on the time division basis by providing a time difference in the GSM and DCS systems and it is more economical to use the switch. The reason why the duplexer (branching filter) is used for separation of signal of the W-CDMA system is that transmission and reception are performed simultaneously with the signals of different frequencies in the W-CDMA system.

The oscillation circuit 130 is controlled to respectively generate the oscillation signals φRF in the frequency of 4220 to 4340 MHz for transmission and reception in the W-CDMA system, in the frequency of 3700 to 3840 MHz for transmission and reception in the GSM system, and in the frequency of 3610 to 3760 MHz for transmission and reception in the DCS system.

The receiving system circuit 120 is provided, in addition to the low-noise amplifying circuit (LNA) 121 and mixers 123a, 123b for the reception signal of the W-CDMA system, with the low-noise amplifying circuit (LNA) 128 and mixers 129a, 129b for the reception signals of the GSM and DCS systems. The switch circuit 125 is provided, in addition to the amplifier switches SWa1, SWb1, with the signal switches SWc1, SWc2 for switching the reception signal of the W-CDMA system and the reception signal of the GSM or DCS system. In addition, the high-gain amplifying unit 124b is provided, in addition to the low-pass filters 242b, 244b for the reception signal of the W-CDMA system, with the low-pass filters 242c, 244c for the reception signals of the GSM and DCS systems and the switches SWc3, SWc4, SWc5, SWc6 for switching of the filters. The other structure is almost the same as that of the first embodiment illustrated in FIG. 1.

Conditions of each switch illustrated in FIG. 8 are set for amplifying the reception signals of the GSM and DCS systems. The reception signals I, Q of the GSM or DCS system which has been amplified with the LNA 128 and down-converted by the mixers 129a, 129b are supplied to the gain control amplifiers 241b, 243b via the switches SWc1, SWc2 and SWa1, SWb1 and are then amplified therein and thereafter supplied, by the switches SWc3, SWc5, to the baseband circuit via the switch circuit 126 from the switches SWc4, SWc6 passing through the low-pass filters 242c, 244c. During the receiving operations of the GSM and DCS systems, all switch conditions are fixed and any switching operation is never performed.

The switches SWc1, SWc2 and SWc3, SWc4, SWc5, and SWc6 are controlled to operate concurrently. In the case of amplifying the reception signal of the W-CDMA system (hereinafter, referred to as the W-CDMA mode) the switches are set to the opposite side from the condition of FIG. 8. Moreover, the switches SWa1, SWb1 and the switches SWa2, SWb2 are interlocked with each other and are then controlled in the same manner as the embodiment of FIG. 1. Namely, when the gain of gain control amplifier is changed in the W-CDMA mode, the switches SWa1, SWb1 and SWa2, SWb2 are switched to control the signals coming from the mixers 123a, 123b to be alternately supplied to the gain control amplifiers 241a, 243a or 241b, 243b.

FIG. 8 illustrates the embodiment wherein filters having different characteristics are provided as the low-pass filters 242b, 242c and 244b, 244c and these filters are switched with the switches SWc3, SWc4 and SWc5, SWc6. However, it is also possible, as illustrated in FIGS. 9A and 9B, that the reception signal of the W-CDMA system or the reception signal of the GSM, DCS systems is processed by using in common a part of the elements (capacitors) and then changing the characteristics thereof.

Figure 9A:
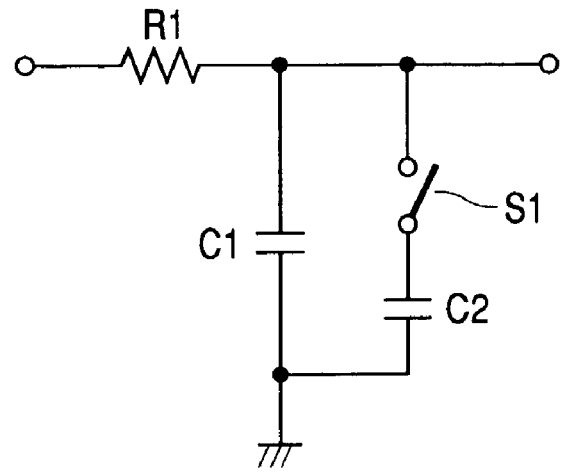
FIGS. 9A and 9B are circuit diagrams illustrating examples of structure of low-pass filter forming the receiving system circuit of the embodiments.
Figure 9B:
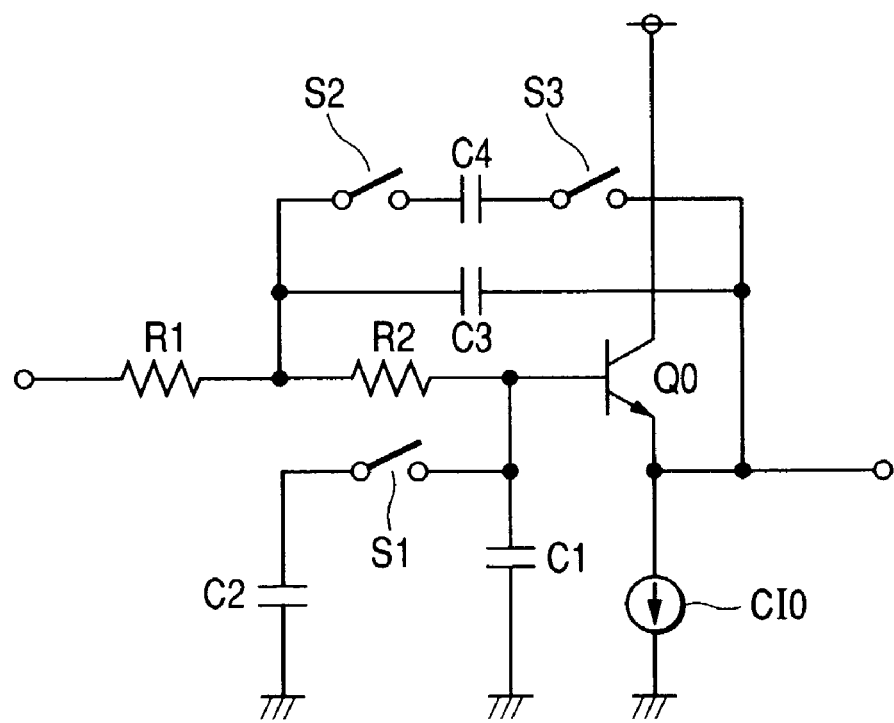

FIG. 9A illustrates an example of the primary filter where an ON/OFF switch S1 and a capacitor C2 connected in series are connected in parallel to the capacitance C1 of filter consisting of a resistor R1 and a capacitor C1. Moreover, FIG. 9B illustrates an example of the secondary filter including a bipolar transistor Q0 and a constant current source CI0 connected to the emitter thereof. The resistors R1 and R2 are connected in series between the input terminal and the base of transistor Q0, the capacitor C1 is connected between the base of Q0 and the ground, the ON/OFF switch S1 and a capacitor C2 connected in series are connected in parallel to the capacitor C1, a capacitor C3 is connected between the connection node of the resistors R1, R2 and the output terminal (emitter of Q0), and a series circuit of ON/OFF switch S2-capacitor C4-switch S3 are connected in parallel to the capacitor C3. Even in any filter, when the switch S1 or switches S1 to S3 are controlled for ON or OFF, the cut-off frequency of the filter is changed.

FIG. 10A to 10F illustrate operation timings of gain variable amplifier under the condition that intensity of reception signal has changed in the receiving system circuit of the second embodiment. FIG. 10A illustrates changes of intensity of the reception signal. FIGS. 10B and 10C illustrate the receiving operation timings in the GSM or DCS mode. FIGS. 10D to 10F illustrate the receiving operation timings in the W-CDMA mode. Moreover, in FIG. 10A to FIG. 10F, the hatched areas indicate the periods where the gain switching operation and DC offset cancellation (calibration) are performed. As illustrated in FIGS. 10B and 10C, since the receiving operation is performed intermittently in the GSM or DCS mode, calibration can be performed without any problem immediately before each receiving operation. Moreover, in FIGS. 10B and 10C, "Rx" means the receiving operation and "Mon" means the monitor operation to detect intensity of the reception signal.

On the other hand, as can be understood from FIG. 10D, since the signal can be received continuously in the W-CDMA mode, as illustrated in FIG. 10E and FIG. 10F, one high-gain amplifying unit (HGA-A or HGA-B) operates in the constant gains Gain A, Gain C during the periods T1, T3 where the reception signal intensity is constant but the high-gain amplifying units of side A and side B (HGA-A and HGA-B) are operated alternately during the period T2 where the reception signal intensity changes. The switching of gain and calibration are performed respectively immediately before the switching of amplifier.

FIGS. 11A to 11E illustrate examples of receiving operation timings during one frame period in the GSM or GCS mode in the receiving system circuit of the second embodiment. In FIGS. 11A to 11E, "Tx" means the transmitting operation.

When the command CMD1 for switching the gain as illustrated in FIG. 11B is supplied to the receiving system circuit 120 from the baseband circuit, the control signal for setting the total gain of the gain control amplifiers GCA1, GCA2, GCA3 to G2 (emitter resistor switching signal in FIG. 3) is given to the high-gain amplifying unit (HGA-B) 124b from the control circuit 127. Accordingly, the conditions of the switches SW11, SW12; SW21, SW22, . . . , SWn1, SWn2 are switched to change the gain (timing t1).

Subsequently, when the command CMD2 for canceling the DC offset is supplied from the baseband circuit, the control signal (control signal for AD converting circuit) for executing the calibration of the gain control amplifiers GCA1, GCA2, GCA3 is given to the high-gain amplifying unit (HGA-B) 124b from the control circuit 127 for canceling the DC offset (timing t2). Thereafter, the high-gain amplifying unit (HGA-B) 124b starts to amplify the reception signal (timing t3).

The control timing in the GSM or DCS mode is never limited to that described above and it is also possible to form the structure that when the command CDM11 for switching the gain as illustrated in FIG. 11D is supplied to the receiving system circuit 120 from the baseband circuit, switching of gain and calibration (timing t11) are performed automatically as illustrated in FIG. 11E on the side of receiving system circuit 120 and thereafter the high-gain amplifying unit (HGA-B) 124b starts to amplify the reception signal (timing t12).

Figure 12:
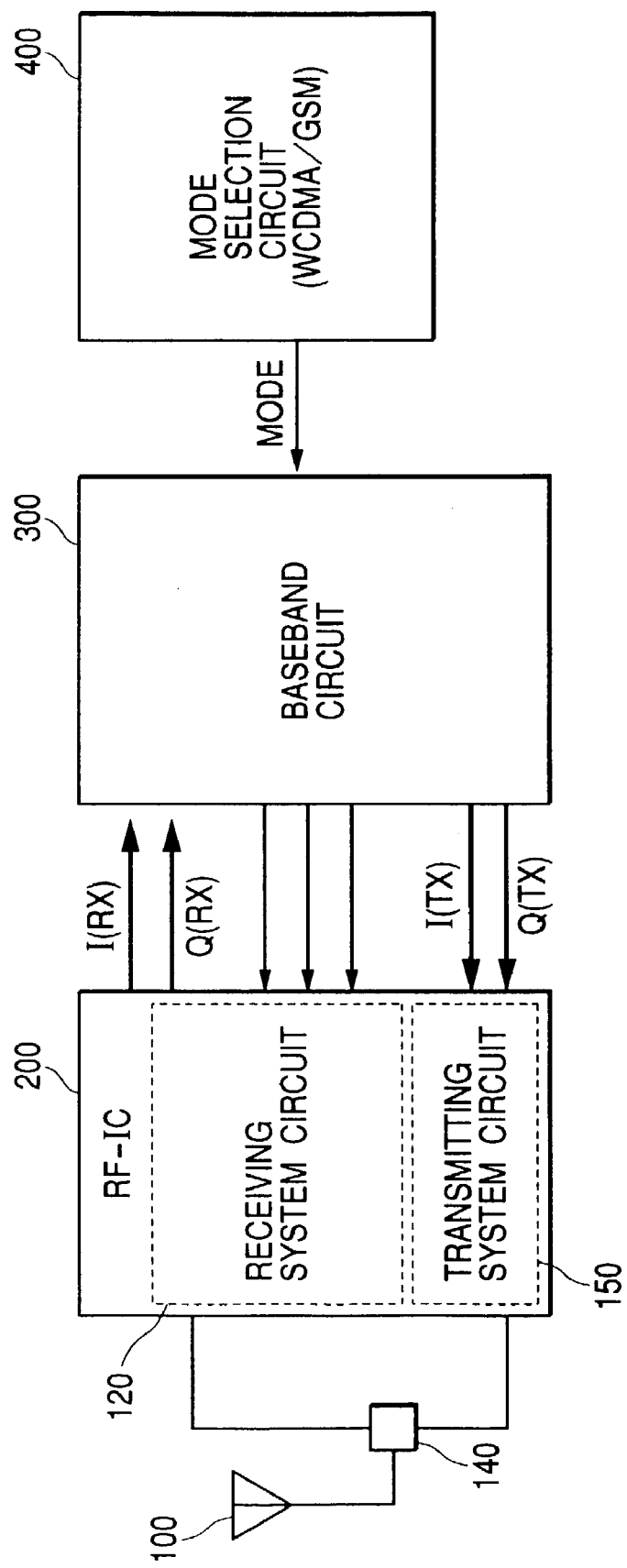
FIG. 12 a block diagram illustrating an example of structure of the portable telephone to which the present invention is suitably applied.

FIG. 12 illustrates an example of structure of the total system of the portable telephone to which the present invention is applied. As illustrated in FIG. 12, the receiving system circuit 120 is formed as the semiconductor integrated circuit (hereinafter, referred to as RF-IC) 200 on one semiconductor substrate together with the transmitting system circuit 150. The I, Q signals demodulated by the receiving system circuit 120 of RF-IC 200 are then supplied to the baseband circuit 300.

The baseband circuit 300 supplies, to the RF-IC 200, the command code, based on the key input signal or the like, for switching the switches SWc1, SWc2 or the like in the switch circuit 125 of the second embodiment with the mode switch signal MODE from the mode selection circuit 400 to judge the transmission and reception mode and also transfers the transmitting data to the RF-IC 200 after conversion to the I, Q signals. The command to the RF-IC 200 from the baseband circuit 300 is not limited to the transmission of the command code and it is also possible to give in direct, from the baseband circuit 300, the signal like the control signal supplied to each switch from the control circuit 127 of the first embodiment. The mode selection circuit 400 may determine the mode depending on the amount of data to be transmitted in place of the key input signal. In this case, the mode selection circuit 400 may be provided within the baseband circuit 300.

The present invention has been described practically based on the preferred embodiments thereof but is never limited thereto and allows various changes and modifications within the scope not departing from the claims thereof. For example, it has been described in both embodiments that two high-gain amplifying circuits 124a and 124b are provided to obtain the time required for cancellation of offset in the W-CDMA system and these amplifying circuits have been used alternately whenever the gain is changed but it is also possible to provide only one high-gain amplifying circuit. The reason is that since the portable telephone of the W-CDMA system is configured to have the function to repair the receiving data, even if only one high-gain amplifying circuit is provided, the receiving data can be repaired, if it is partly lost, by performing switching of the gain and the cancellation of offset in the adequate timing in the course of the reception and thereby any problem does not occur in the receiving operation.

Moreover, in above embodiments, the offset canceling circuit is respectively provided in the high-gain amplifying units for amplifying the reception signal, but it is also possible to sequentially cancel the offset by providing the common offset canceling circuit for a plurality of high-gain amplifying units. In addition, in above embodiments, the receiving system circuit and transmitting system circuit are formed on one semiconductor chip but these may also be formed on the individual semiconductor chips. Structure of the gain variable amplifier is not limited only to the circuits illustrated in FIG. 3 and FIG. 4 and the gain variable amplifiers of the other circuit system and those formed of MOSFET may also be used.

In above description, the present invention has been described considering the example of application into the dual-mode portable telephone enabling the communication in both W-CDMA and GMS system or DCS system which is the application field as the background of the invention and into the RF-IC as the semiconductor integrated circuit device for communication used in the same portable telephone. However, the present invention is not limited thereto and can also be utilized for the portable telephone of the triple mode which is formed to enable the communication of the system called the EDGE (Enhanced Data Rates for GMS Evolution) for the QPSK modulation in which the amplitude shift is further added to the phase shift of the GMSK modulation and moreover for the portable telephone of the quad mode in which the other communication systems have been added.

The effects of the present invention can be described as follows.

Namely, in the semiconductor integrated circuit device for communication which forms a wireless communication system of the dual-mode or higher level modes including the W-CDMA system, the step amplifier can be used as the gain control amplifier for amplifying the reception signal. Accordingly, in the portable telephone using such step amplifier, power consumption may be kept almost constant even when the gain is changed depending on the intensity of the reception signal and thereby the life span of battery, namely the reception waiting period and communication period obtained by single charging process can be expanded.

Moreover, according to the present invention, it is possible to realize the semiconductor integrated circuit device for communication which can widen the gain control range of gain control amplifier for amplifying the reception signal to improve the CN ratio and also to realize the wireless communication system using the same semiconductor integrated circuit device.

What is claimed is:

1. A semiconductor integrated circuit device comprising:
    gain control amplifiers of two or more systems for amplifying a reception signal; and
    offset canceling circuits for canceling DC offsets of said gain control amplifiers, whereby
    if gain is changed while a signal transmitted in a continuous system is amplified with any one of said gain control amplifiers, gain of the other gain control amplifier is changed and the gain control amplifier to which the reception signal is supplied after the offset of the other relevant gain control amplifier is canceled by said offset canceling circuit is switched to start an amplifying operation.

2. A semiconductor integrated circuit device according to claim 1, wherein said gain control amplifier is capable of changing step by step the gain thereof.

3. A semiconductor integrated circuit device according to claim 2, wherein the gain control amplifier of any one system among said gain control amplifiers of two or more systems is capable of amplifying the signal transmitted in a non-continuous system and the signal transmitted in the continuous system with a common circuit.

4. A semiconductor integrated circuit device according to claim 3, wherein said gain control amplifier is provided with two or more filters of different cut-off frequencies and a switch means for selecting any one of these filters for transmitting the reception signal and said filters are switched for amplifying said signal transmitted in a non-continuous system and the signal transmitted in the continuous system.

5. A wireless communication system comprising
    a semiconductor integrated circuit device which includes gain control amplifiers of two or more systems for amplifying a reception signal and offset canceling circuits for canceling DC offsets of said gain control amplifiers, in which if gain is changed while a signal transmitted in a continuous system is amplified with any one of said gain control amplifiers, gain of the other gain control amplifier is changed and the gain control amplifier to which the reception signal is supplied after the offset of the other relevant gain control amplifier is canceled by said offset canceling circuit is switched to start an amplifying operation, and
    a baseband circuit for giving a command to select the reception signal to be amplified with said semiconductor integrated circuit device, whereby the command to designate the gain of said gain control amplifier is given, for amplifying the signal transmitted in a non-continuous system, to said semiconductor integrated circuit device from said baseband circuit in the predetermined period, while the command to designate the gain of said gain control amplifier is given, for amplifying the signal transmitted in the continuous system, to said semiconductor integrated circuit device from said baseband circuit in the timing depending on the intensity of the reception signal.

* * * * *